(12) United States Patent
Shin

(10) Patent No.: US 6,316,358 B1
(45) Date of Patent: Nov. 13, 2001

(54) METHOD FOR FABRICATING AN INTEGRATED CIRCUIT DEVICE

(75) Inventor: Jong-Chan Shin, Kyunggi-do (KR)

(73) Assignee: Samsung Electronics Co., Ltd. (JP)

( * ) Notice: Subject to any disclaimer, the term of this patent is extended or adjusted under 35 U.S.C. 154(b) by 0 days.

(21) Appl. No.: 09/346,271

(22) Filed: Jul. 1, 1999

(30) Foreign Application Priority Data

Jul. 3, 1998 (KR) .................................................. 98-26917

(51) Int. Cl.[7] .................................................. H01L 21/44
(52) U.S. Cl. .......................................... 438/669; 438/671
(58) Field of Search ..................................... 438/669, 671

(56) References Cited

U.S. PATENT DOCUMENTS

| | | | |
|---|---|---|---|
| 5,391,441 | * | 2/1995 | Imai et al. ................................. 430/5 |
| 5,521,032 | * | 5/1996 | Imai et al. ................................. 430/5 |
| 5,918,148 | * | 6/1999 | Sato ....................................... 438/669 |
| 5,933,724 | * | 8/1999 | Sekiguchi et al. ..................... 438/669 |

* cited by examiner

*Primary Examiner*—John F. Niebling
*Assistant Examiner*—Lynne Gurley
(74) *Attorney, Agent, or Firm*—Cantor Colburn LLP

(57) ABSTRACT

A method for forming a uniform conductive pattern on an integrated circuit substrate having a step by a single photography process. An exposure mask has a different pattern in accordance with the topology of the integrated circuit substrate. The exposure mask has a increased inter-pattern space at a lower portion of the step and has a reduced inter-pattern space at a upper portion of the step. During the exposure process, a sufficient amount of light is applied to a photoresist layer at the lower portion of the step and an optical amount of light is applied to the photoresist layer at the upper portion of the step. As a result, scum phenomenon at the lower portion of the step can be prevented. Further, overetching of the conductive pattern at the upper portion of the step can be prevented.

2 Claims, 4 Drawing Sheets

METHOD FOR FABRICATING AN INTEGRATED CIRCUIT DEVICE

FIELD OF THE INVENTION

The present invention relates to semiconductor manufacturing, and more particularly to a method of forming a metal line on an integrated circuit substrate having a step.

BACKGROUND OF THE INVENTION

One of the important technologies for progress in micro-size processing is photolithography. Past progress in this technology resulted from a reduction of the exposing wavelength and high numerical aperture (NA) of a contracting projection lens in a contracting projection exposure device (stepper). The reduction in wavelength and the high NA impose non-meritorious conditions in increasing the depth of focus (DOF) since the DOF is proportional to the exposing wavelength λ and inversely proportional to the square of the numerical aperture NA.

On the other hand, the surface step difference of a semiconductor wafer, as an object to be exposed to light, tends to increase year by year in keeping with high integration density of the semiconductor integrated circuit. The reason is that, under the current technology towards three-dimensional device structure, contraction in the three dimensional direction is not as significant as that in the two-dimensional direction due to necessity in maintaining the performance and reliability of the integrated circuit. If a photoresist material is coated on the surface of a semiconductor wafer having such significant step difference, larger surface step difference or variations in the film thickness are produced on the photoresist layer.

On the other hand, the imaging surface cannot be perfectly smooth due to the presence of distortion in the imaging surface, while the substrate surface is slightly tilted from a surface which is perfectly normal to an optical axis of the projection optical system. These factors render difficult the uniform light exposure of the entire wafer in the sole imaging plane.

FIGS. 1A to 1D shows cross-sectional views of an integrated circuit substrate, at selected stages of process steps of forming a metal line, illustrating problems associated with photographic process with respect to uneven top surface topology. Referring to FIG. 1A, the integrated circuit substrate is divided into a cell array region "B" and a peripheral region "A". As can be seen, the integrated circuit substrate has a large step (height difference $T_o$) between the cell array region and peripheral region due to previously-formed integrated circuit elements (not shown) such as a capacitor in cell array region "B". An interlayer insulating layer 10 is formed on the integrated circuit substrate including the integrated circuit elements. A metal layer 12 for metallization is formed on the interlayer insulating layer 10. As can be seen, the top surface of the metal line follows the contour of the underlying step. The metal layer 12 has a thickness of $T_m$ both in the lower portion of the step and upper portion of the step. In order to form a metal pattern, a photoresist layer 14 is spin coated on the metal layer 12. Since the photoresist layer 14 is conformal, the photoresist layer 14 is formed thickly in the lower portion of the step as compared to that in the upper portion of the step (see reference numeral $T_l$ and $T_h$). As a result, height difference between the cell array region and peripheral region is changed from original $T_o$ to $T_f$.

A mask substrate 16 having mask pattern 18 is provided. The size of the mask pattern 18 defines the size of the desired metal line. Further, space between the mask pattern 18 and the next defines the space between the metal line and the next. As can be seen, mask pattern size (Ll) in the lower portion of the step is equal to the space (Sl) between adjacent mask patterns in the lower portion of the step. Mask pattern size (Lh) in the upper portion of the step is equal to the space (Sh) between adjacent mask patterns in the upper portion of the step.

Using the mask substrate 16 and mask pattern 18, the photoresist layer 14 is exposed to light to form a photoresist pattern 14a as shown in FIG. 1B. If light exposure is insufficient, the photoresist layer 14 in the lower portion of the step (i.e., in the peripheral region) is not completely exposed to the light due to the relatively larger thickness as compared to that in the upper portion of the step (i.e., cell array region). As a result, a portion of the photoresist layer 14 is left in the low portion of the step (i.e., in the peripheral region), thereby causing the so called scum phenomenon or bridge phenomenon. Further, in the case where the light energy is large enough to sufficiently avoid these problems, excessive amounts of light can be applied to the photoresist layer 14 in the upper portion of the step. As a result, other problems arise. For example, the desired pattern may not be obtained due to excessive light exposure and notching phenomenon occurs due to excessive loss of the photoresist layer 14.

Using the photoresist pattern 14a as an etching mask, the conductive layer 12 is etched to form conductive pattern 12a as shown in FIG. 1C. If the conductive layer 12 is not sufficiently selectively etched with respect to the photoresist pattern 14a, the photoresist pattern 14a is etched simultaneously. For example, partial thickness of the photoresist pattern ($T_e$) is etched in the lower portion of the step and all the photoresist pattern 14a is etched in the upper portion of the step as shown in FIG. 1C. More specifically, since the photoresist pattern is thinner in the upper portion of the step than in the lower portion of the step, upper portion of the step is firstly exposed to the light. Accordingly, a partial thickness of the conductive pattern 12a (see reference numeral $T_{me}$) can be over-etched, producing the so called notching phenomenon. The resulting conductive pattern 12a in the upper portion of the step has a thickness of $T_m$–$T_{me}$.

Photoresist layer 14 may be formed very thickly to overcome the above-mentioned problems. The focus margin, however is inversely proportional to the thickness of the photoresist layer 14, thereby making it difficult to apply practical manufacturing. Alternately, several photolithography processes may be performed with respect to the step so as to obtain an optical conductive pattern. This method also has a problem associated with fabrication cost.

Referring now to FIG. 1D, a remainder of the photoresist layer 14 is removed to form conductive pattern 12a. Resulting conductive pattern 12a, however, has a thickness of $T_{me}$–$T_{me}$ in the upper portion of the step.

Accordingly, a method is needed which can form a uniform conductive pattern 12a on an integrated circuit substrate having a step without above mentioned problems.

SUMMARY OF THE INVENTION

The present invention was made in view of the above-described problems, and it is therefore an object of the invention to provide a method for forming a uniform conductive pattern on an integrated circuit substrate having a step by the use of a single photography process.

A mask substrate, which is used in the photography process for patterning a photoresist layer, has different pattern sizes according to topology of the integrated circuit substrate. The mask substrate has a relatively wide pattern size and narrow space between adjacent patterns in the upper portion of the step in the integrated circuit substrate as compared to that of the desired conductive pattern. On the other hand, the mask substrate has a relatively narrow pattern size and wide space between adjacent patterns in the lower portion of the step as compared to that of the desired conductive pattern. Such mask pattern allows a uniform conductive pattern regardless of the topology of the integrate circuit substrate.

More specifically, in accordance with the present invention, a method for fabricating an integrated circuit device is formed by providing an integrated circuit substrate. A cell array region and a peripheral region are defined therein. Transistors are formed on both cell array and peripheral regions conventionally. Capacitors are formed only on the cell array region to constitute memory cell array together with formerly-formed transistors. An insulating layer is formed on the resulting structure. Since capacitors are formed only on the cell array region, the insulating layer has an uneven surface, i.e., a step between the cell array region and peripheral region. The position of the cell array region is higher than the peripheral region due to underlying structure such as capacitors. A conductive material is deposited on the insulating layer. The conductive layer also has a step following the contour of the underlying insulating layer.

A photoresist layer is then spin coated on the resulting structure. Since the photoresist layer is conformal, it is firstly deposited on the lower portion of the step and then deposited on the upper portion of the step. As a result, the photoresist layer has a different thickness, relatively thick on the lower portion of the step and relatively thin on the upper portion of the step.

In order to form a uniform conductive pattern without regard to thickness variation of the photoresist layer, a mask substrate having different pattern size is provided in accordance with the present invention. More specifically, the mask substrate has a relatively wide pattern size and narrow space between adjacent patterns in the upper portion of the step in the integrated circuit substrate as compared to that of the desired conductive pattern. On the other hand, the mask substrate has a relatively narrow pattern size and wide space between adjacent patterns in the lower portion of the step as compared to that of the desired conductive pattern.

The relatively narrow space between adjacent mask patterns at the upper portion of the step can supply a small amount of exposure light with a thin photoresist layer while a relatively wide space between adjacent mask patterns at lower portion of the step can supply a great amount of exposure light with a thick photoresist layer. As a result, uniform conductive pattern can be obtained.

Using the mask substrate, the photoresist layer is then exposed to light to form the photoresist pattern. Using the resulting photoresist pattern as an etching mask, the conductive layer is etched to form uniform conductive pattern.

In accordance with the present invention, exposure energy of light can be adjusted in accordance with the thickness of the photoresist layer and thereby avoid overetching of the photoresist layer in the upper portion of the step and thus avoid the notching phenomenon. As a result, uniform conductive pattern can be obtained.

BRIEF DESCRIPTION OF THE DRAWINGS

The invention may be understood and its objects will become apparent to those skilled in the art by reference to the accompanying drawings as follows.

DETAILED DESCRIPTION OF THE PREFERRED EMBODIMENTS

Figure 1A:
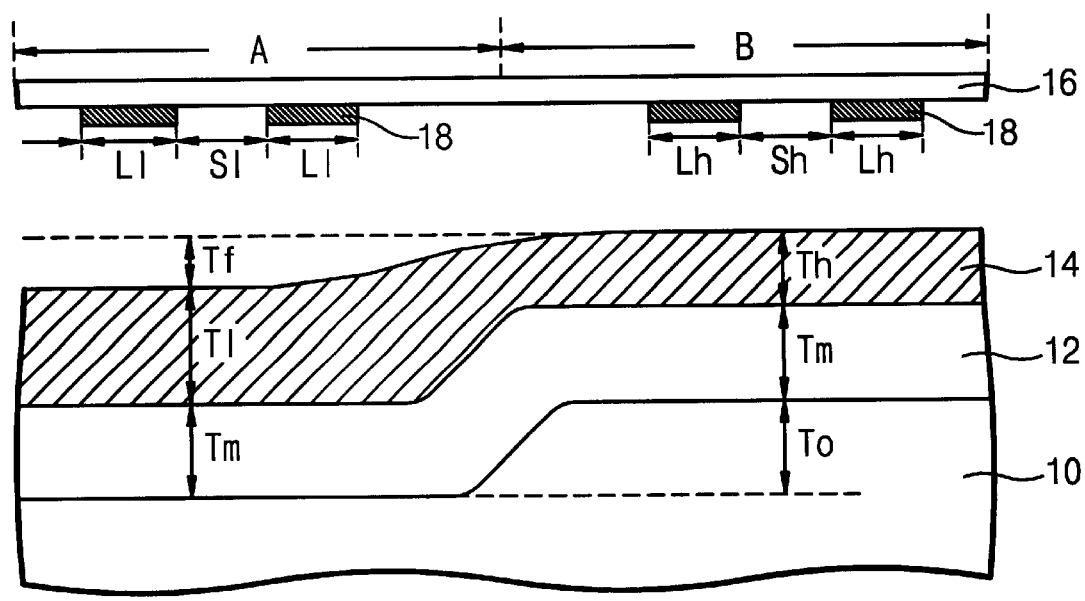
FIGS. 1A to 1D are flow diagrams showing the process steps of a method of forming a conductive pattern, illustrating problems with photographic process with respect to uneven top surface topology.
Figure 1B:
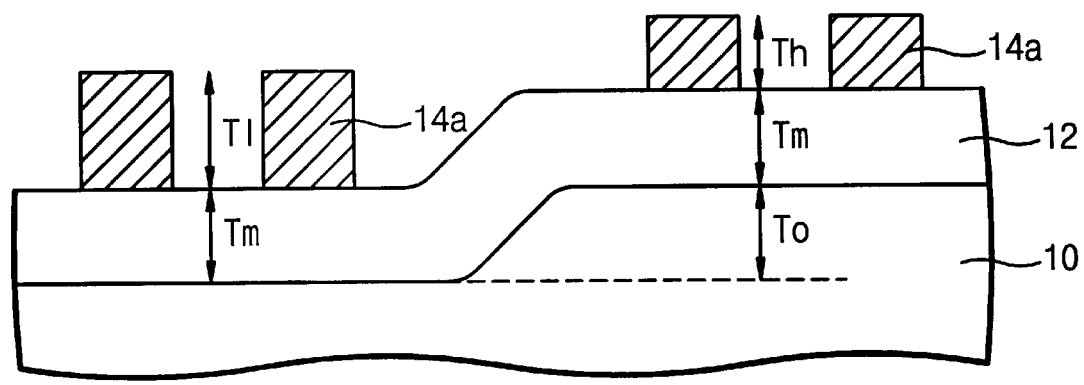
Figure 1C:
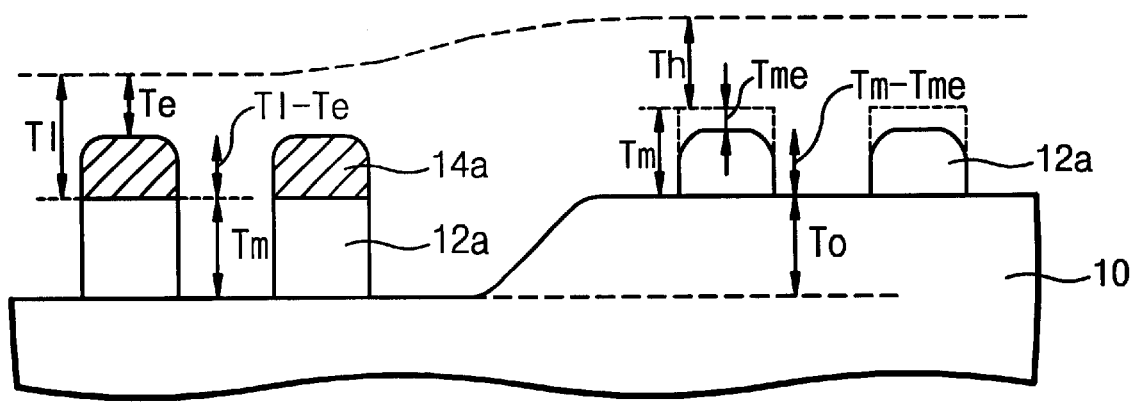
Figure 1D:
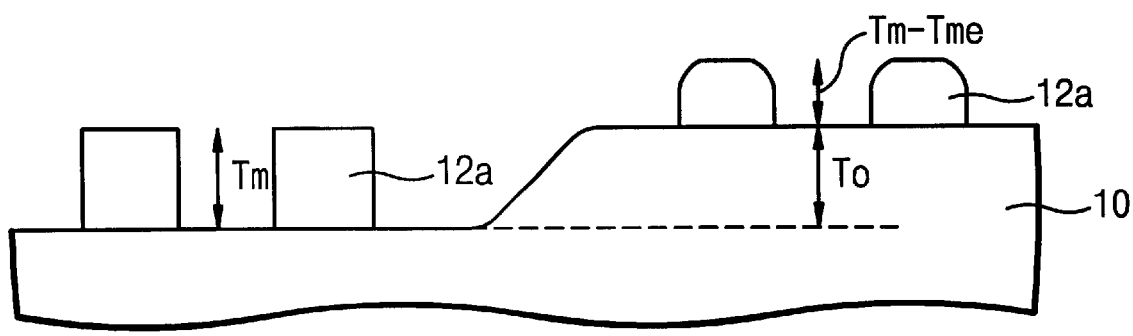

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate or intervening layers may also be present. In contrast, when an element is referred to as being "directly on" another element, there are no intervening elements present. Moreover, each embodiment described and illustrated herein includes its complementary conductivity type embodiment as well.

Figure 2A:
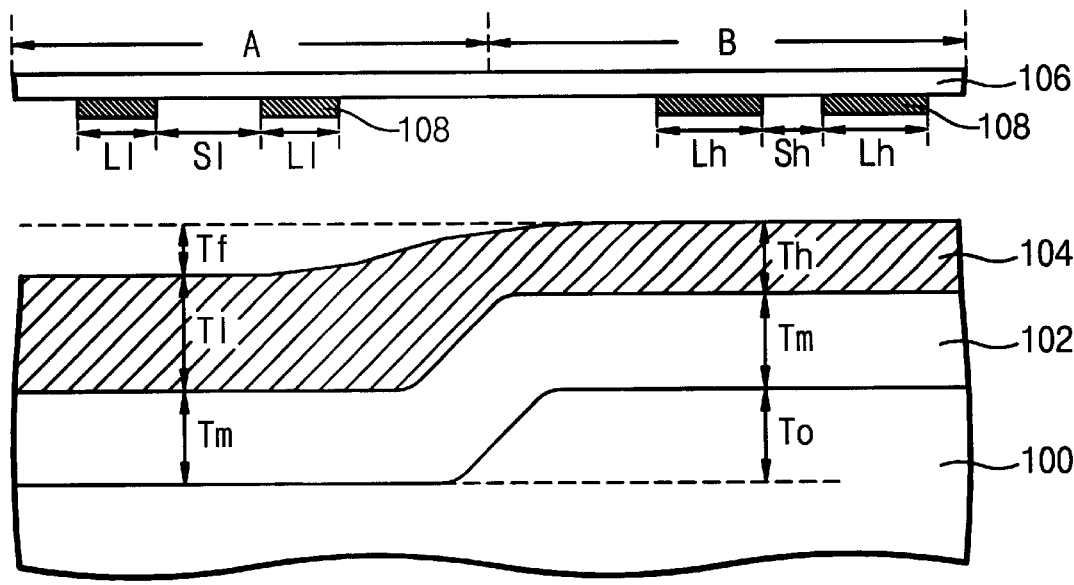
FIGS. 2A to 2D are flow diagrams showing the process steps of a novel method of forming a conductive pattern.

FIG. 2A schematically shows an integrated circuit substrate having already undergone several process steps in accordance with the present invention. The integrated circuit substrate is divided into a cell array region "B" and a peripheral region "A". As can be seen, the integrated circuit substrate has a large step (height difference $T_o$) between the cell array region and peripheral region due to previously-formed integrated circuit elements (not shown) such as capacitors in the cell array region "B". An interlayer insulating layer 100 is formed on the integrated circuit substrate including the integrated circuit elements. A conductive layer 102 for metallization is formed on the interlayer insulating layer 100 to a predetermined thickness. For example, the metal layer has a thickness of $T_m$ both in the lower portion of the step and upper portion of the step. As can be seen, the top surface of the metal line follows the contour of underlying step topology. In order to form a metal pattern, a photoresist layer 104 is spin coated on the metal layer 102. Since the photoresist layer 104 is conformal, the photoresist layer 104 is formed thickly in the lower portion of the step as compared to that in the upper portion of the step (see reference numeral $T_l$ and $T_h$, respectively). As a result, the height difference between the cell array region and peripheral region is changed from original $T_o$ to $T_f$.

A mask substrate 106 having a mask pattern 108 is provided. More particularly, the mask substrate is made of a transparent mask substrate 106 such as a quartz and an opaque mask pattern 108 such as a chrome thereon. The formation of the mask substrate 106 begins by providing chrome on the quartz substrate. A positive resist (not shown) is applied thereon, being patterned by electron beam irradiation and development and is etched to form the mask pattern 118. The resulting mask pattern 118 is characterized in that the mask pattern 118 for the lower portion (see region "A") of the step has an increased space "Sl" between adjacent mask patterns "Ll" as compared to the desired conductive pattern which is to be formed on the substrate. On the other hand, the mask pattern 118 for the upper portion (see region "B") of the step has a decreased space "Sh"

between adjacent mask patterns "Lh" as compared to the desired conductive pattern.

The increased mask pattern size Lh (i.e., the decreased space between mask pattern sizes) at the upper portion of the step can limit the light energy and the increased space size Sl between mask patterns at the lower portion of the step can allow sufficient light energy, thereby ensuring formation of the desired conductive pattern on the semiconductor wafer having a step.

Figure 2B:
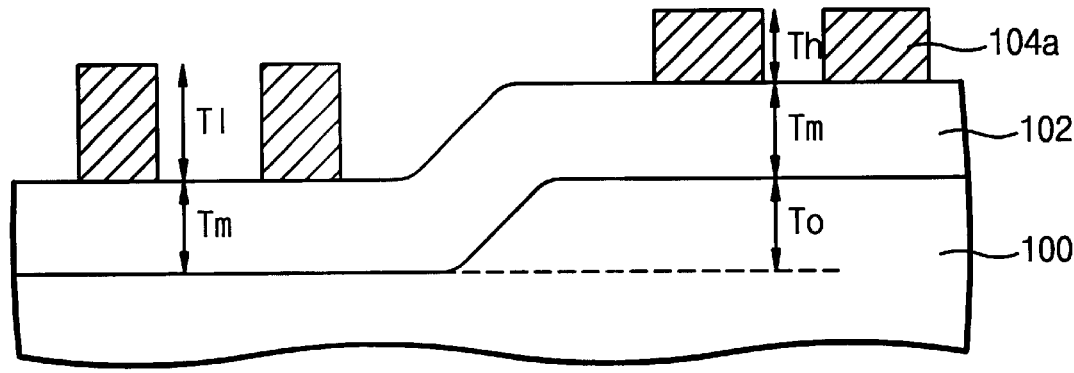

Using the mask substrate 106 and mask pattern 108, the photoresist layer 104 is exposed to light to form a photoresist pattern 104*a* as shown in FIG. 2B. Extended space (Sl) between the mask patterns in the lower portion of the step can provide sufficient amount of light with the thick photoresist layer and reduced space (Sh) between the mask patterns in the upper portion of the step can prevent excessive amount of light. Namely, extended space (Sl) in the peripheral region "A" ensures complete exposure thereof and reduced space (Sh) in the cell array region "B" prevents excessive amounts of light. As a result, the photoresist layer 104 is not left at the lower portion of the step, thereby avoiding the scum phenomenon or bridge phenomenon.

Figure 2C:
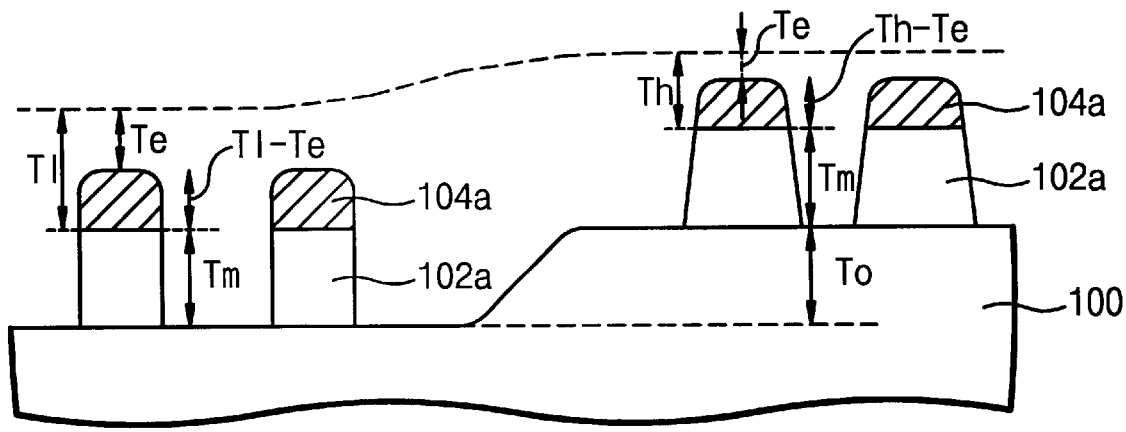

Using the photoresist pattern 104*a* as an etching mask, the conductive layer 102 is etched to form conductive pattern 102*a* as shown in FIG. 2C. At this time, a partial thickness of the photoresist pattern 104*a* is etched (see reference numeral $T_e$).

Due to reduced inter-mask pattern space (Sh) at the upper portion of the step, the photoresist pattern 104*a* remains during exposure and etching processes and thereby protects the underlying desired conductive layer 102.

Figure 2D:
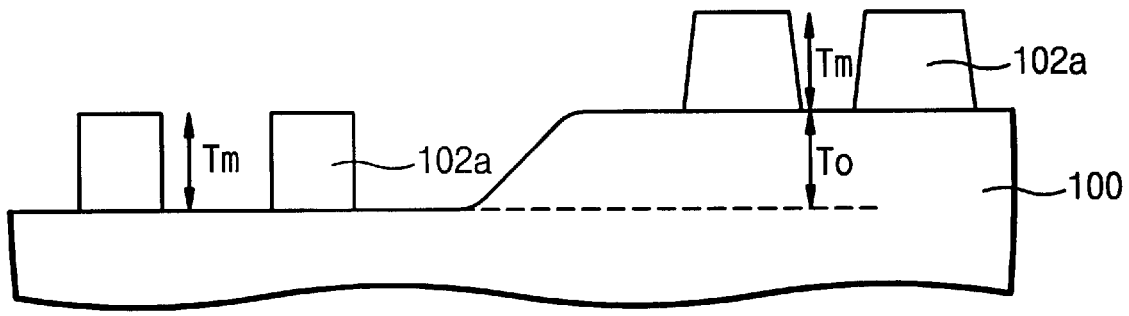

Finally, a remainder of the photoresist pattern 104*a* is removed by a conventional technique, as shown in FIG. 2D. As a result, desired size ($T_m$) of the conductive pattern 102*a* can be obtained.

As understood from the explanation, the present invention provides a uniform conductive pattern on an integrated circuit substrate having a step through single photography process. To this end, the present invention uses a mask for the exposure process, wherein the mask has a different pattern size. The mask has a relatively wide pattern size and narrow space between adjacent patterns in the upper portion of the step in the integrated circuit substrate as compared to desired conductive pattern. On the other hand, the mask substrate has a relatively narrow pattern size and wide space between adjacent patterns in the lower portion of the step as compared to desired conductive pattern. As a result, increased inter-mask pattern space can provide sufficient amount of light with the thick photoresist layer at the lower portion of the step and reduced inter-mask pattern space can provide optical amount of light with the thin photoresist layer at the upper portion of the step.

What is claimed is:

1. A method of forming conductive patterns on an integrated circuit topology, said integrated circuit topology having a high region and a low region, said method comprising:

forming an insulating layer and a conductive layer on an integrated circuit topology and following the topology of said integrated circuit substrate;

depositing a photoresist layer on said conductive layer, such that a thickness of said photoresist layer is larger on said low region than on said high region;

exposing said photoresist layer into a light source using a photo-mask to form a photoresist pattern;

wherein said photo-mask is composed of a transparent mask substrate and opaque mask patterns thereon, and said mask patterns for said low region have a wider space between adjacent opaque mask patterns than desired conductive patterns and said mask patterns for said high region have a narrower space between adjacent opaque mask patterns than said desired conductive patterns; and anisotropically etching said conductive layer using said photoresist pattern to form said desired conductive patterns.

2. The method according to claim 1, wherein the mask substrate is made of a quartz and said mask pattern is made of a chrome.

* * * * *

UNITED STATES PATENT AND TRADEMARK OFFICE
CERTIFICATE OF CORRECTION

PATENT NO. : 6,316,358 B1
DATED : November 13, 2001
INVENTOR(S) : Jong-Chan Shin It is certified that error appears in the above-identified patent and that said Letters Patent is hereby corrected as shown below:

Column 2,
Line 55, before "in the" delete "$T_{me}-T_{me}$" and insert -- $T_m-T_{me}$ --

Signed and Sealed this

Ninth Day of August, 2005

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 6,316,358 B1 |
| APPLICATION NO. | : 09/346271 |
| DATED | : November 13, 2001 |
| INVENTOR(S) | : Jong-Chan Shin |

It is certified that error appears in the above-identified patent and that said Letters Patent is hereby corrected as shown below:

Title Page:
Item (73), Assignee, delete "(JP)" and insert therefor -- (KR) --

Signed and Sealed this

Eighteenth Day of September, 2007

JON W. DUDAS
*Director of the United States Patent and Trademark Office*